US012756400B2

(12) United States Patent
Zakas et al.

(10) Patent No.: US 12,756,400 B2
(45) Date of Patent: Oct. 6, 2026

(54) ANALOG-TO-DIGITAL CONVERTER SYSTEM FOR SWITCHING OPERATING MODES

(71) Applicant: Analog Devices, Inc., Wilmington, MA (US)

(72) Inventors: Nicholas S. Zakas, Wilmington, MA (US); Huseyin Dinc, Chapel Hill, NC (US); Jesse Bankman, High Point, NC (US)

(73) Assignee: Analog Devices, Inc., Wilmington, MA (US)

(*) Notice: Subject to any disclaimer, the term of this patent is extended or adjusted under 35 U.S.C. 154(b) by 140 days.

(21) Appl. No.: 18/933,599

(22) Filed: Oct. 31, 2024

(65) Prior Publication Data

US 2025/0167793 A1 May 22, 2025

Related U.S. Application Data

(60) Provisional application No. 63/600,463, filed on Nov. 17, 2023.

(51) Int. Cl.
*H03M 1/10* (2006.01)

(52) U.S. Cl.
CPC ....... *H03M 1/1009* (2013.01); *H03M 1/1019* (2013.01)

(58) Field of Classification Search
CPC ............ H03M 1/12; H03M 1/00; H03M 1/10; H03M 1/1009; H03M 1/1038
(Continued)

(56) References Cited

U.S. PATENT DOCUMENTS

| | | | | |
|---|---|---|---|---|
| 5,668,551 A * | 9/1997 | Garavan | ............. | H03M 1/1009 341/172 |
| 7,403,556 B2 | 7/2008 | Kao et al. | | |

(Continued)

FOREIGN PATENT DOCUMENTS

| | | |
|---|---|---|
| EP | 3432474 | 1/2019 |
| JP | 2001308804 | 11/2001 |
| JP | 2003115763 | 4/2003 |

OTHER PUBLICATIONS

"European Application Serial No. 24212743.9, Extended European Search Report mailed Apr. 9, 2025", 11 pgs.

(Continued)

*Primary Examiner* — Peguy Jean Pierre
(74) *Attorney, Agent, or Firm* — Schwegman Lundberg & Woessner, P.A.

(57) ABSTRACT

An analog-to-digital converter (ADC) system for switching between a first operating mode and a second operating mode, where both the first operating mode and the second operating mode can include post-calibration analog-to-digital conversions, where a hardware circuitry configuration of the second operating mode can differ from a hardware circuitry configuration of the first operating mode, can include hardware circuitry. The ADC system can also include a controller, which can be configured to control the hardware circuitry to control switching between the first operating mode and the second operating mode in response to a command to switch from the first operating mode to the second operating mode. This can include to transmit second mode configuration information and second mode calibration information to the hardware circuitry, where the second mode configuration information can include values to configure the hardware circuitry to operate in the second operating mode and the second mode calibration information can (Continued)

include values to calibrate the ADC system while operating in the second operating mode.

20 Claims, 6 Drawing Sheets

(58) Field of Classification Search
USPC .......................................... 341/143, 155, 120
See application file for complete search history.

(56) References Cited

U.S. PATENT DOCUMENTS

| | | | | |
|---|---|---|---|---|
| 8,681,896 | B1 * | 3/2014 | Chen | H04B 1/30 375/220 |
| 10,084,469 | B1 | 9/2018 | Pflum | |
| 10,868,556 | B2 * | 12/2020 | Camponeschi | H03M 1/0836 |
| 11,962,318 | B2 * | 4/2024 | Varshney | H03M 1/0624 |
| 2018/0138919 | A1 | 5/2018 | Björk et al. | |
| 2021/0028791 | A1 | 1/2021 | Xu | |
| 2021/0367607 | A1 | 11/2021 | Molina et al. | |
| 2022/0239313 | A1 | 7/2022 | Le et al. | |

OTHER PUBLICATIONS

Manganaro, Gabriele, "Interleaving ADCs: Unraveling the Mysteries", Analog Dialogue 49-07, (Jul. 1, 2015), 5 pgs.
"European Application Serial No. 24212743.9, Response filed Sep. 15, 2025 to Extended European Search Report mailed Apr. 9, 2025", w/ English Claims, 19 pgs.
"Japanese Application Serial No. 2024-199820, Notification of Reasons for Rejection mailed Dec. 2, 2025", w/ English Translation, 12 pgs.

* cited by examiner

ANALOG-TO-DIGITAL CONVERTER SYSTEM FOR SWITCHING OPERATING MODES

CLAIM OF PRIORITY

This patent application claims the benefit of priority of Zakas et al., U.S. Provisional Patent Application Ser. No. 63/600,463, entitled "MODE SWITCHING IN DATA CONVERSION SYSTEMS," filed on Nov. 17, 2023, which is hereby incorporated by reference herein in its entirety.

TECHNICAL FIELD

The present disclosure relates to electronics, and more particularly, but not by way of limitation, to a system for switching operating modes of an analog-to-digital converter (ADC).

BACKGROUND

Modern systems can use ADCs to convert an analog signal into a digital signal for processing, storage, or communication. Examples of such modern systems include communication systems, radar systems, measuring systems, and monitoring systems. In these and other modern systems, the operating properties of the ADC may be of interest.

SUMMARY

In an example, an analog-to-digital converter (ADC) system for switching between a first operating mode and a second operating mode, where both the first operating mode and the second operating mode can include post-calibration analog-to-digital conversions, where a hardware circuitry configuration of the second operating mode can differ from a hardware circuitry configuration of the first operating mode, can include hardware circuitry. The ADC system can also include a controller, which can be configured to control the hardware circuitry to control switching between the first operating mode and the second operating mode in response to a command to switch from the first operating mode to the second operating mode. This can include to transmit second mode configuration information and second mode calibration information to the hardware circuitry, where the second mode configuration information can include values to configure the hardware circuitry to operate in the second operating mode and the second mode calibration information can include values to calibrate the ADC system while operating in the second operating mode.

In an example, a method for switching between a first operating mode and a second operating mode of an analog-to-digital converter (ADC), where both the first operating mode and the second operating mode can include post-calibration analog-to-digital conversions, where a hardware circuitry configuration of the second operating mode can differ from a hardware circuitry configuration of the first operating mode, can include transmitting second mode configuration information and second mode calibration information to hardware circuitry of the ADC. The second mode configuration information can include values to configure the hardware circuitry to operate in the second operating mode and the second mode calibration information can include values to calibrate the ADC while operating in the second operating mode. The method can also include triggering the hardware circuitry to begin operating in the second operating mode.

In an example, an analog-to-digital converter (ADC) system for switching between a first operating mode and a second operating mode, where both the first operating mode and the second operating mode can include post-calibration analog-to-digital conversions, where a hardware circuitry configuration of the second operating mode can differ from a hardware circuitry configuration of the first operating mode, can include hardware circuitry. The ADC system can also include a controller, which can be configured to control the hardware circuitry to control switching between the first operating mode and the second operating mode in response to a command to switch from the first operating mode to the second operating mode. This can include transmitting second mode configuration information and second mode calibration information to the hardware circuitry, where the second mode configuration information can include values to configure the hardware circuitry to operate in the second operating mode and the second mode calibration information can include values to calibrate the ADC system while operating in the second operating mode. The ADC system can also include a controller, which can be configured to control the hardware circuitry to control switching between the first operating mode and the second operating mode in response to a command to switch from the first operating mode to the second operating mode. The hardware circuitry can include calibration storage registers, which can be configured to receive the second mode calibration information, and calibration operation registers, which can be configured to hold the calibration information for an operating mode.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

DETAILED DESCRIPTION

The present inventors have recognized, among other things, that it may be desirable for an ADC system to switch from one operating mode to another operating mode. For example, a second operating mode can have one or more characteristics (e.g., sampling rate, signal-to-noise ratio (SNR), spur location, power consumption) that differ from those in a first operating mode. For this reason, it can be desirable to switch from the first operating mode to the second operating mode.

In an approach, an ADC system can switch modes by changing the hardware configuration and rebooting the ADC system. During the reboot, data to operate the switched-to mode can be generated. For example, a calibration of the ADC system can take place, which can generate calibration information.

It can be desirable to switch from the first operating mode to the second operating mode within a specified amount of time, which can include a limited amount of time. For example, it can be desirable to switch from the first operating mode to the second operating mode without requiring one or more of power cycling or rebooting the ADC system.

An ADC system can store information corresponding to two or more modes, which can include one or more of mode configuration information, mode data (e.g., mode calibration data), or mode state information. When switching from the first mode to the second mode, the ADC system can transfer one or more of mode data or mode state information to the hardware circuitry, which can remove a desire to power cycle and/or reboot the ADC system.

Figure 1:
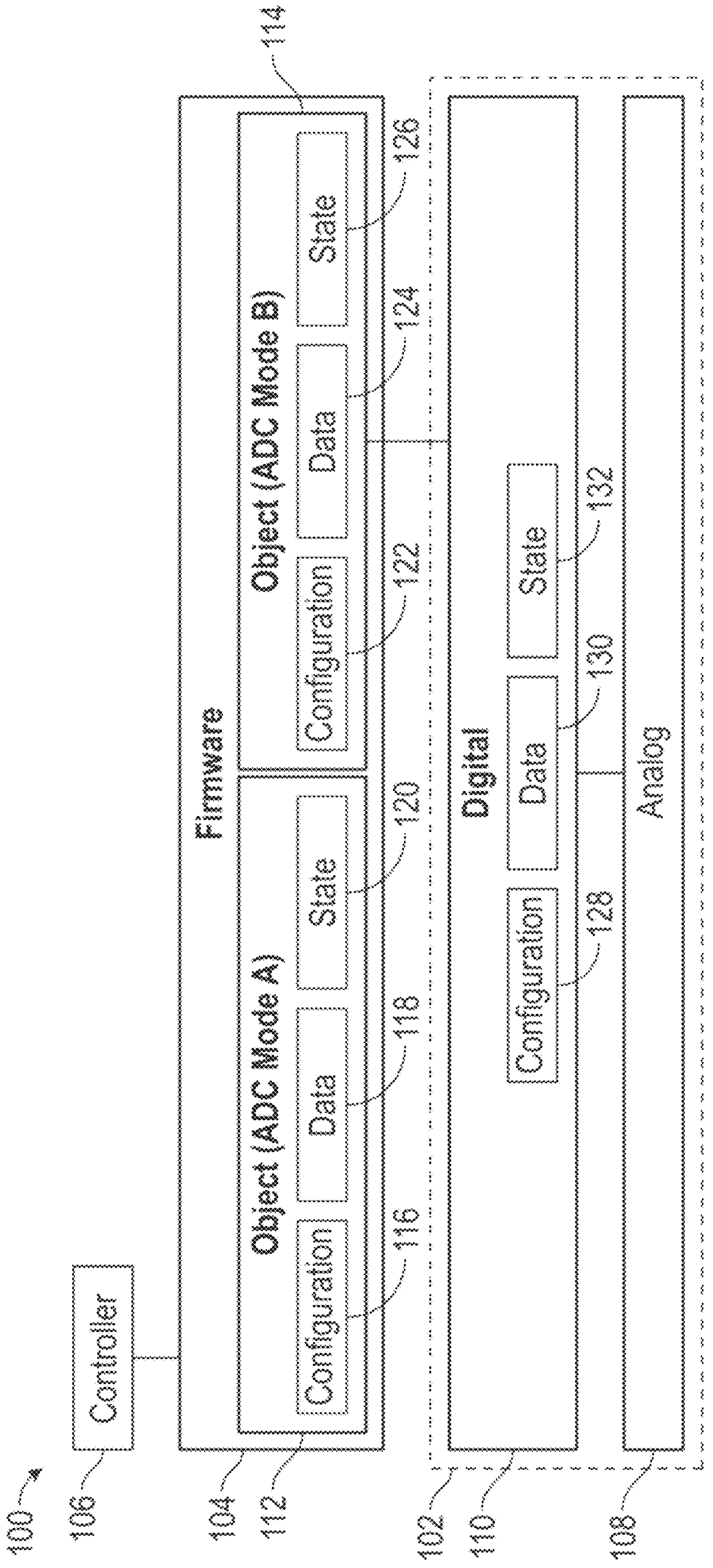
FIG. 1 shows a block diagram of an example of portions of an ADC system.

FIG. 1 shows a block diagram of an example of portions of an ADC system 100. In the example of FIG. 1, the ADC system 100 can include hardware circuitry 102, firmware block 104, and a controller 106. The ADC system 100 can be configured for switching between a first operating mode and a second operating mode.

In an example, one or more of the first operating mode or the second operating mode can include post-calibration analog-to-digital conversions. For example, the ADC system 100 can be configured to perform analog-to-digital conversions that are used to calibrate the ADC, such as during startup and/or initialization. The output from these calibration analog-to-digital conversions can be used to adjust the ADC system 100, which can include adjusting an accuracy of the ADC system 100 (e.g., by generating calibration information). In an example, the output from these calibration conversions need not be transmitted outside of the ADC system 100 (e.g., the output may only be used internally). A post-calibration analog-to-digital conversion can include an analog-to-digital conversion that one or more of occurs after the calibration of the ADC system 100, is output from the ADC system 100, or is used for a non-calibration task (e.g., used by a separate system from the ADC system 100). For example, in a post-calibration analog-to-digital conversion, the ADC system 100 can be used to measure a voltage signal (e.g., convert an analog voltage into a digital representation of this voltage), and this measured voltage can be sent to a spectrum analyzer to analyze signals or signal components within the voltage signal.

The ADC system 100 can include any ADC style, such as can include one or more of delta-sigma, successive approximation, interleaving, residue generating, flash, or integration. In an example, the ADC system 100 can include an interleaving ADC.

The hardware circuitry 102 can include analog hardware circuitry 108 and digital hardware circuitry 110. The analog hardware circuitry 108 can be configured to receive an analog signal (e.g., a voltage signal, a current signal). The analog hardware circuitry 108 can be configured to process the received analog signal in one or more ways, (e.g., amplification, filtering, sampling). The analog hardware circuitry 108 can be configured to pass a representation of the received analog signal to the digital hardware circuitry 110.

The digital hardware circuitry 110 can be configured to convert the received representation of the analog signal to a digital representation of the analog signal. In an example, an operating mode of the hardware circuitry 102 can be configurable. For example, a hardware circuitry 102 configuration of the second operating mode can differ from a hardware circuitry 102 configuration of the first operating mode. In an example, any portion of the hardware circuitry 102 can be configurable. The configuration of the hardware circuitry 102 can include any parameter (e.g., configurable parameter), such as can include one or more of a sampling rate, a preprocessing configuration (e.g., amplification, filtering), or a conversion configuration (e.g., random or pseudo-random vs sequential), a postprocessing configuration (e.g., amplification, filtering).

The digital hardware circuitry 110 can include configuration operation information 128, calibration operation information 130, and state operation information 132. The configuration operation information 128 can include information that configures the hardware circuitry 102 (e.g., the digital hardware circuitry 110) to operate in a specified mode. For example, the digital hardware circuitry 110 can include one or more registers configured to store digital configuration values (e.g., configuration operation registers, such as to store the configuration operation information 128).

The calibration operation information 130 can include information that is used by the hardware circuitry 102 (e.g., the digital hardware circuitry 110) during operation, such as calibration values (e.g., in a look-up-table) and/or other data. The calibration operation information 130 can be stored in one or more registers within the digital hardware circuitry 110 (e.g., calibration operation registers).

The state operation information 132 can include information that is used by the hardware circuitry 102 (e.g., the digital hardware circuitry 110) during operation, such as to determine the state of the hardware circuitry 102 (e.g., determine where the hardware circuitry 102 is in a sequence of operations). In an example, the state operation information 132 can be included in the calibration operation information 130. The state operation information 132 can be stored in one or more registers within the digital hardware circuitry 110 (e.g., state operation registers).

The firmware block 104 can include one or more of instructions or other data (e.g., to operate the ADC system 100, to calibrate the ADC system 100, to configure the ADC system 100). The firmware block 104 can include a first mode object 112 and a second mode object 114. The first mode object 112 can include information related to the first mode, which can include first mode configuration information 116, first mode calibration information 118, and first mode state information 120. The second mode object 114 can include information related to the second mode, which can include second mode configuration information 122, second mode calibration information 124, and second mode state information 126.

The controller 106 can include any hardware capable of executing instructions. In an example, the controller 106 can be included in the firmware block 104. The controller 106 can be configured to control the hardware circuitry 102, the firmware block 104, or both. The controller 106 can be configured to control switching between the first operating mode and the second operating mode, such as in response to a command to switch from the first operating mode to the second operating mode (e.g., a command from a system external to the ADC system 100). For example, one or more of the configuration operation information 128, the calibration operation information 130, or the state operation information 132 can contain information related to the first operating mode (e.g., from the first mode object 112). To switch to the second operating mode, it can be desirable to transfer one or more pieces of information from the second mode object 114 to the hardware circuitry 102. For example, one or more of the second mode configuration information 122, the second mode calibration information 124, or the second mode state information 126 can be transferred to the hardware circuitry 102. In an example, the controller 106 can control the ADC system 100 to transmit second mode configuration information and second mode calibration information to the hardware circuitry, where the second mode configuration information can include values to configure the hardware circuitry 102 to operate in the second operating mode and the second mode calibration information can include values to calibrate the ADC system 100 while operating in the second operating mode. In an example, the controller 106 can be configured to transmit state information to the hardware circuitry 102. The first mode state information 120 can include values to program a state of a hardware circuitry 102 state machine (e.g., a state machine using the state operation information 132). For example, the controller 106 can be configured to transmit the second mode state information 126 to the state operation information 132.

Following receipt of the information related to the second operating mode, the hardware circuitry 102 may begin operating in the second operating mode. In an example, the hardware circuitry 102 may wait until a signal (e.g., a signal from the controller 106) triggers the hardware circuitry 102 to begin operating in the second operating mode. In an example, the second operating mode can begin operating without requiring the ADC system to power cycle or reboot. This can reduce a length of time required to switch from the first operating mode to the second operating mode, reduce a length of time that the ADC system 100 is not producing usable outputs (e.g., post calibration analog-to-digital conversions), or both. This, in turn, can help improve continuity or reduce instability in the system in which the ADC system 100 is employed.

In an example, the controller 106 can be configured to configure the hardware circuitry 102 to operate in the second operating mode and record the second mode calibration information 124, such as at startup. Alternatively or in addition the controller 106 can be configured to configure the hardware circuitry 102 to operate in the first operating mode and record first mode calibration information 118, such as at startup. In this example, the ADC system 100 can place valid calibration data in one or more of the first mode calibration information 118 or the second mode calibration information 124 at startup, which can allow the ADC system 100 to switch between modes without requiring recalibration during runtime.

In an example, the ADC system 100 can recurrently (e.g., periodically) recalibrate the operating mode. This can include recurrently updating the calibration operation information 130. The ADC system 100 can write this updated calibration operation information 130 to the corresponding operating mode. For example, if the first operating mode is operating, the calibration operation information 130 can be written to the first mode calibration information 118. If the second operating mode is operating, the calibration operation information 130 can be written to the second mode calibration information 124. This can recurrently update the firmware stored calibration information for the operating mode.

In an example, an operating mode (e.g., the second operating mode) may not be used for a length of time, and during this length of time, the stored calibration values can go stale (e.g., the stored calibration values no longer provide a specified level of accuracy and/or precision, such as due to changes (e.g., drift) in the hardware circuitry 102). In an example, the ADC system 100 can switch to the unused operating mode (e.g., switch to the second operating mode), perform a calibration, and write the calibration values to the firmware (e.g., perform a calibration while operating in the second operating mode and write the values from the calibration operation information 130 to the second mode calibration information 124). In an example, this can be done without using any of the outputs from the ADC system 100 while operating in the second operating mode in a post-calibration activity (e.g., no post-calibration analog-to-digital conversions occur while in the second operating mode). For example, the calibration values of the second operating mode can become stale, such as because the first operating mode is the desired operating mode for a specified period of time. The ADC system 100 can switch to the second operating mode (e.g., during a down-time of the first operating mode, such as when analog-to-digital conversions are not desired), update the calibration values of the second operating mode (e.g., such as without using any values in post-calibration activity), and then switch back to the first operating mode, such as to begin producing values for post-calibration activity (e.g., after the down-time is over).

In an example, the ADC system 100 can include an interleaving ADC. An interleaving ADC can include two or more interleaving slices (e.g., each containing an ADC), which can be operated in parallel, such as with a timing offset. This can increase a sampling rate of the interleaving ADC. However, calibration information, such as can be related to timing mismatches, gain errors, or offset differences, can be used to calibrate an interleaving ADC.

In an example in which the ADC system 100 includes an interleaving ADC, the first operating mode can include a sequential operating mode. In a sequential operating mode, the interleaving slices can sample sequentially (e.g., such as 1, 2, 3, 4, 1, 2, 3, 4 for an ADC operating on four interleaving slices). In an example, the second operating mode can include a random or pseudo-random operating mode (e.g., the interleaving slices sample in a random fashion or a pseudo-random (e.g., configured to look random, but following a specified order) fashion).

The first operating mode (e.g., the sequential operating mode) can have a higher signal-to-noise ratio than the second operating mode. The second operating mode (e.g., the random or pseudo-random operating mode) can have smaller spurs in an operating spectrum (e.g., frequency ranges with uneven gains) than the first operating mode. This can make it desirable to operate in the first operating mode when a higher signal-to-noise ratio is specified, operate in the second operating mode when smaller spurs are desired, or both.

In an example, the first operating mode includes a sequential operating mode and the second operating mode includes a sequential operating mode with a different number of interleaving slices than the first operating mode. In an example, the first operating mode can include more interleaving slices than the second operating mode. In this example, the first operating mode can have a higher sampling rate than the second operating mode. In this example, the second operating mode can have a higher signal-to-noise ratio than the first operating mode.

In an example, the first operating mode can include a different timing than the second operating mode, such as alternatively or in addition to including a different number of interleaving slices. This different timing can move a location of one or more spurs in the operating spectrum, which can make it desirable to select the operating mode based upon the region of interest in the operating spectrum (e.g., select a mode with no or reduced spurs in the region of interest).

In an example, the first operating mode and the second operating mode can have a different level of power consumption. For example, the second mode can have a lower power consumption than the first mode, such as can be due to a lower sampling rate. This can make it desirable to switch to the second mode to conserve energy, such as when the characteristics of the second mode are sufficient for the task (e.g., the higher sampling rate of the first mode may not be required for all tasks).

In an example, there can be any number of operating modes, such as can include two operating modes, three operating modes, four operating modes, or five or more operating modes. The modes can be hardwired (e.g., the firmware block 104 can have hard-coded operating modes, which need not be configurable after manufacture, such as can include part or all of the first mode configuration information 116 being read-only memory, part or all of the first mode calibration information 118 being read-only memory, or both), or can be configurable (e.g., the information in the first mode configuration information 116 can be changed, the information in the first mode calibration information 118 can be changed, or both, such as prior to or during runtime), which can help allow for the ADC system 100 to be configured to have specified modes and/or specified calibration information (e.g., calibrated calibration information).

Figure 2:
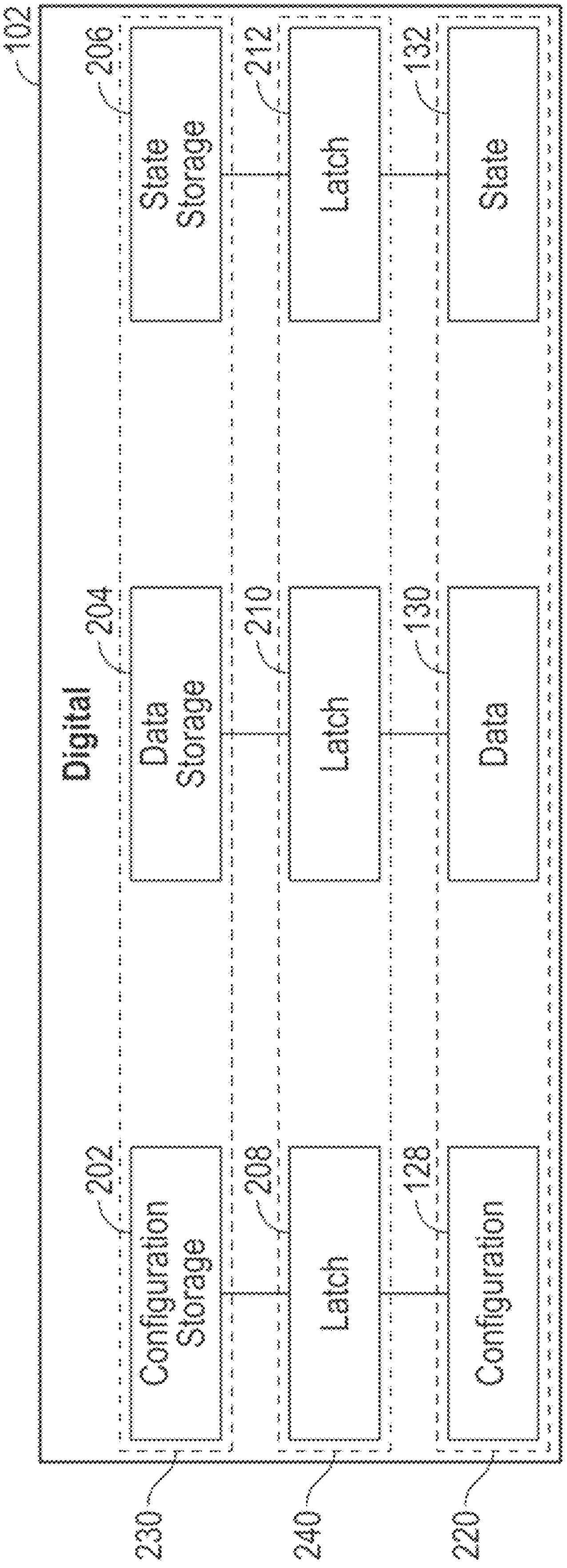
FIG. 2 shows a block diagram of an example of portions of hardware circuitry.

FIG. 2 shows a block diagram of an example of portions of hardware circuitry 102, such as can be included in the ADC system 100. In the example of FIG. 2, the hardware circuitry 102 can include operation registers 220, storage registers 230, and a latch circuit 240.

The operation registers 220 can store (e.g., hold) information being used by the operating mode. This can include one or more of the configuration operation information 128, the calibration operation information 130, or the state operation information 132.

The storage registers 230 can store information that is received from the firmware block 104, such as information related to a mode transition (e.g., second operating mode information when the ADC system 100 is operating in the first operating mode). The storage registers 230 can store the transferred information until the controller 106 triggers the hardware circuitry 102 to begin operating in the second operating mode. The storage registers 230 can include one or more of the configuration storage information 202, the calibration storage information 204, or the state storage information 206.

The latch circuit 240 can be configured to write the values from the storage registers 230 to the operation registers 220, such as in response to the controller 106 triggering the hardware circuitry 102 to begin operating in the second mode. The latch circuit 240 can include a configuration latch 208, a calibration latch 210, and a state latch 212.

In an example, the hardware circuitry 102 includes calibration storage registers, which can be configured to receive the second mode calibration information 124. The hardware circuitry 102 can also include calibration operation registers, which can be configured to hold the calibration operation information 130 for an operating mode. The hardware circuitry 102 can include a latch circuit (e.g., the calibration latch 210, the latch circuit 240), which can be configured to write the values from the calibration storage registers to the calibration operation registers, such as when the controller 106 triggers the hardware circuitry 102 to begin operating in the second operating mode.

Figure 3:
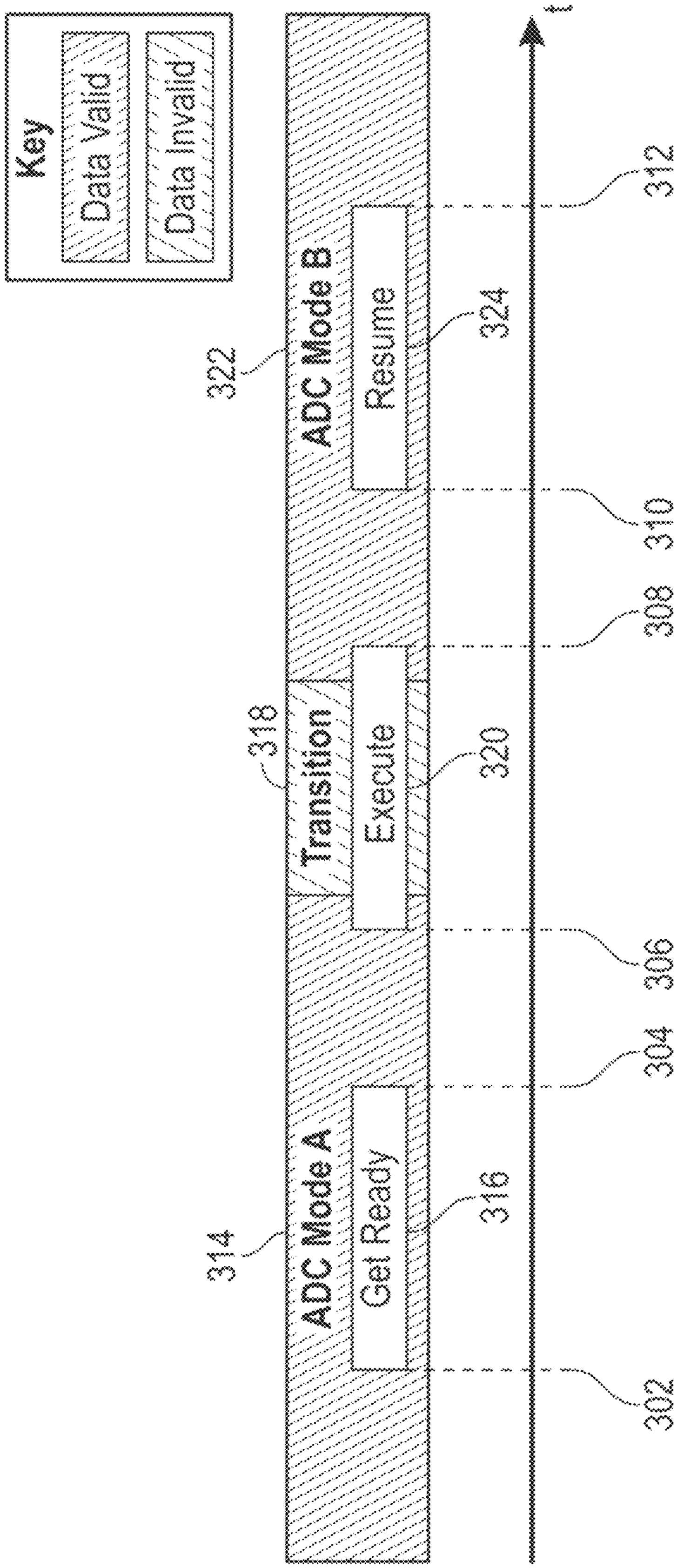
FIG. 3 shows a timing diagram of an example of operating portions of an ADC system.

FIG. 3 shows a timing diagram of an example of operating portions of an ADC system 100. FIG. 3 shows that transitioning from the first operating mode to the second operating mode can include a time period with the first mode operational 314, a time period with the second mode operational 322 and a transition state 318 time period (e.g., when neither mode is operational). The mode transition can include a preparation stage 316, a transition stage 320, and a resume stage 324.

FIG. 3 shows that initially, the ADC system 100 can be operating in the first operating mode. At time 302, the ADC system 100 can begin preparing to switch modes. The operations performed in the preparation stage 316 can include one or more of pausing calibrations, converting calibration coefficients to a format to be stored (e.g., look-up-table values), writing the saved values back to the firmware block 104 (e.g., writing from the calibration operation information 130 to the first mode calibration information 118), or writing information from the second operating mode to the hardware circuitry 102 (e.g., staging information, such as by writing to the storage registers 230). For example, before triggering the hardware circuitry 102 to begin operating in the second mode, the controller 106 can be configured to one or more of pause calibration of the first operating mode, or record first mode calibration information, such as including values to calibrate the ADC system while operating in the first operating mode. At time 304, the preparation stage 316 can finish.

At time 306, the transition stage 320 can begin. The operations performed in the transition stage 320 can include one or more of latching the staged information (e.g., transferring values from the storage registers 230 to the operation registers 220 using the latch circuit 240), or writing the configuration to the hardware circuitry 102 (e.g., writing from the second mode configuration information 122 to the configuration operation information 128). For example, the hardware circuitry 102 need not be configured to stage the configuration information, and the configuration information may be written directly to the configuration operation information 128 during the transition stage 320. At time 308, the transition stage 320 can finish. The transition stage 320 can be initiated automatically following the preparation stage 316 (e.g., after a specified or no waiting time), or can be triggered by the controller 106. In an example, the transition stage 320 can begin following the controller 106 triggering the hardware circuitry 102 to begin operating in the second operating mode (e.g., such as following transmitting the second mode calibration information).

At time 310, the resume stage 324 can begin. During the resume stage 324, calibrations can be reenabled. In an example, the calibrations can be enabled automatically, such as during or at the end of the transition stage 320. In this example, the resume stage 324 can be omitted. The resume stage 324 can finish at time 312.

In an example, one or more of the registers (e.g., a portion of, all) in the hardware circuitry 102 need not include a latch circuit. In this example, the registers without a latch circuit can be written to directly as data is transferred, such as during the preparation stage 316 or the transition stage 320. In this example, the resume stage 324 can overlap with one or more of the transition stage 320 or the transition state 318. For example, the ADC system 100 can continue producing conversion data, and this data can be used by one or more systems. In an example, this data may have a specified level of accuracy, which can be lower than a specified level of accuracy prior to and/or following the mode transition (e.g., because one or more registers have values for the second operating mode while the first operating mode is still operating).

Figure 4:
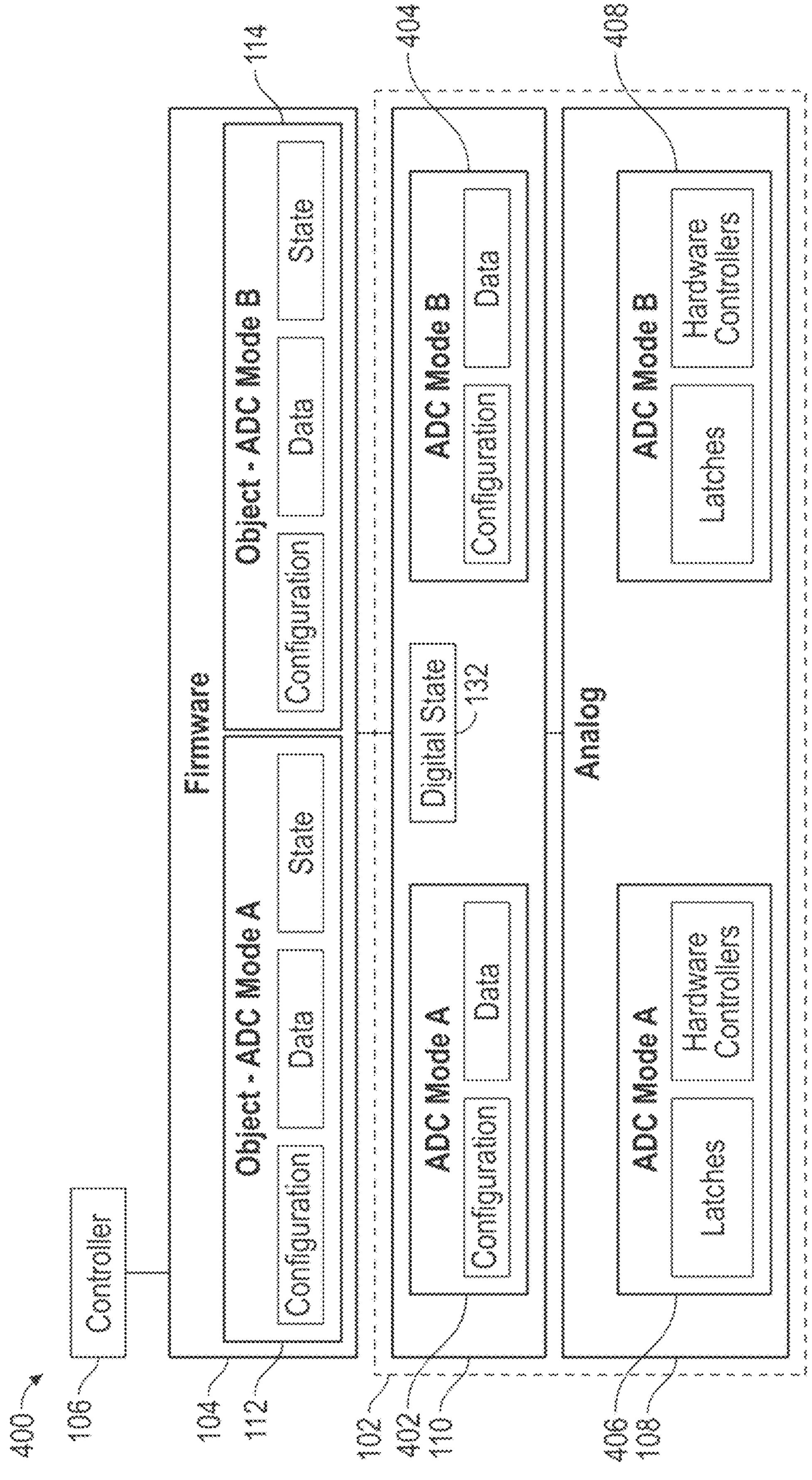
FIG. 4 shows a block diagram of an example of portions of an ADC system.

FIG. 4 shows a block diagram of an example of portions of an ADC system 400. In an example, the ADC system 400 can be configured similarly to the ADC system 100. In an example, the ADC system 400 can differ in one or more ways.

FIG. 4 shows that in the ADC system 400, the digital hardware circuitry 110 can include first operating mode digital hardware circuitry 402 and second operating mode digital hardware circuitry 404, the analog hardware circuitry 108 can include first operating mode analog hardware circuitry 406 and second operating mode analog hardware circuitry 408, or both. In the example of FIG. 4, some portions of the hardware circuitry 102 can be duplicated, which can allow for hardware circuitry dedicated to the first operating mode or second operating mode. For example, the first operating mode digital hardware circuitry 402 and the second operating mode digital hardware circuitry 404 can replace one or more of the configuration operation information 128 or the calibration operation information 130.

In this example, some information that was passed from the firmware block 104 to the digital hardware circuitry 110 in the example of FIG. 1 need not be passed. The first operating mode digital hardware circuitry 402 and the second operating mode analog hardware circuitry 408 can store mode specific digital conversion information, which can include configuration information and data (e.g., calibration information). For example, the first mode configuration information 116 and the first mode calibration information 118 can be stored in the first operating mode digital hardware circuitry 402, such as can remove a desire to pass this information from the firmware block 104 to the hardware circuitry 102. When the ADC system 400 switches from the first operating mode to the second operating mode, the hardware circuitry 102 can begin using the second operating mode digital hardware circuitry 404 and the second operating mode analog hardware circuitry 408, can stop using the first operating mode digital hardware circuitry 402 and the first operating mode analog hardware circuitry 406, or both. However, the information in the first operating mode digital hardware circuitry 402 and/or the first operating mode analog hardware circuitry 406 need not be overwritten, the information in the second operating mode digital hardware circuitry 404 and/or the second operating mode analog hardware circuitry 408 need not be transmitted from the firmware block 104, or both.

The first operating mode analog hardware circuitry 406 and second operating mode analog hardware circuitry 408 can include mode specific front-end circuitry, which can perform one or more of sampling, filtering, or amplification. The first operating mode analog hardware circuitry 406 can be directly linked to the first operating mode digital hardware circuitry 402. The second operating mode analog hardware circuitry 408 can be directly linked to the second operating mode digital hardware circuitry 404.

The state operation information 132 can represent the current state of the digital hardware circuitry 110. This can make it desirable to keep only a single state operation information 132 (e.g., because the digital hardware circuitry 110 may only be able to be in one state at a time, it may be beneficial to store and/or transmit indications of the present state from the firmware block 104). For example, even though configuration registers and/or calibration registers may be duplicated for the first operating mode and the second operating mode, one or more other portions of the digital hardware circuitry 110 need not be duplicated, and may be shared by the first operating mode and the second operating mode.

When switching from the first operating mode to the second operating mode, the ADC system 400 may behave similarly to the ADC system 100. In an example, only the state operation information 132 is written to by the first mode object 112 or the second mode object 114. In an example, the operative one of the first operating mode digital hardware circuitry 402 or the second operating mode digital hardware circuitry 404 can be selected using a “pointer” within the digital hardware circuitry 110 (e.g., the respective one of the first operating mode digital hardware circuitry 402 or the second operating mode digital hardware circuitry 404 that is pointed to is the one that operates). In an example, the operative one of the first operating mode analog hardware circuitry 406 or the second operating mode analog hardware circuitry 408 can be selected using a “pointer” within the digital hardware circuitry 110. In this way, the configuration information and/or the calibration information need not be passed from the firmware block 104 to switch modes.

In an example, the hardware circuitry 102 can periodically transmit information between the first mode object 112 and the first operating mode digital hardware circuitry 402 and/or the first operating mode analog hardware circuitry 406. In an example, the hardware circuitry 102 can periodically transmit information between the second mode object 114 and the second operating mode digital hardware circuitry 404 and/or the second operating mode analog hardware circuitry 408. For example, the firmware block 104 can transmit information to the digital hardware circuitry 110 after a configuration of the first operating mode and/or the second operating mode is specified.

Figure 5:
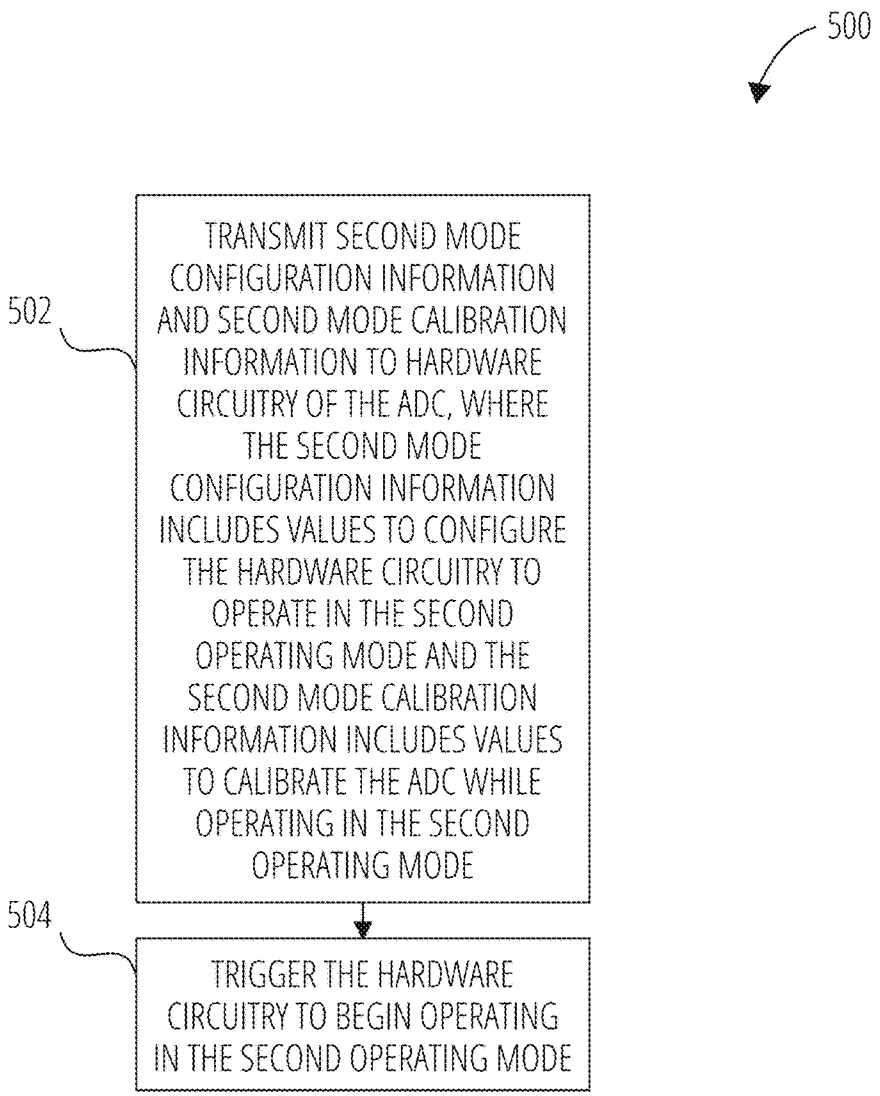
FIG. 5 shows an example of portions of a method for operating an ADC system.

FIG. 5 shows an example of portions of a method 500 for operating an ADC system, such as the ADC system 100. The method 500 can be a method for switching between a first operating mode and a second operating mode of an analog-to-digital converter (ADC). One or more of the first operating mode and the second operating mode can include post-calibration analog-to-digital conversions. A hardware circuitry configuration of the second operating mode can differ from a hardware circuitry configuration of the first operating mode.

At step 502 second mode configuration information and/or second mode calibration information can be transmitted to hardware circuitry of the ADC. The second mode configuration information can include values to configure the hardware circuitry to operate in the second operating mode. The second mode calibration information can include values to calibrate the ADC while operating in the second operating mode. The hardware circuitry can include the hardware circuitry 102. The second mode configuration information can be transmitted to the configuration operation information 128. The second mode calibration information can be transmitted to the calibration operation information 130.

At step 504, the hardware circuitry can be triggered to begin operating in the second operating mode. For example, a controller (e.g., the controller 106) can trigger the hardware circuitry 102 to begin operating in the second operating mode. This can include waiting, following transmitting the second mode configuration information and the second mode calibration information, until a “switch” signal is received before triggering the hardware circuitry to begin operating in the second operating mode.

In an example, such as prior to switching to the second operating mode, calibration of the first operating mode can be paused. First mode calibration information can be recorded, including values to calibrate the ADC while operating in the first operating mode.

In an example, data generated by the ADC while operating in the second operating mode can be discarded (e.g., not used by an external system, not used for post-calibration operations). Calibration of the second operating mode can be paused. First mode configuration information and/or the first mode calibration information can be transmitted to the hardware circuitry. The hardware circuitry can be triggered to begin operating in the first operating mode.

In an example, the ADC can include an interleaving ADC. The first operating mode can include a sequential operating mode. The second operating mode can include a random or pseudo-random operating mode. The method can include switching to the second operating mode when an operating spectrum with smaller spurs is specified. The method can include switching to the first operating mode when a higher signal-to-noise ratio is specified.

The shown order of steps is not intended to be a limitation on the order in which the steps are performed. In an example, two or more steps may be performed simultaneously or at least partially concurrently.

Figure 6:
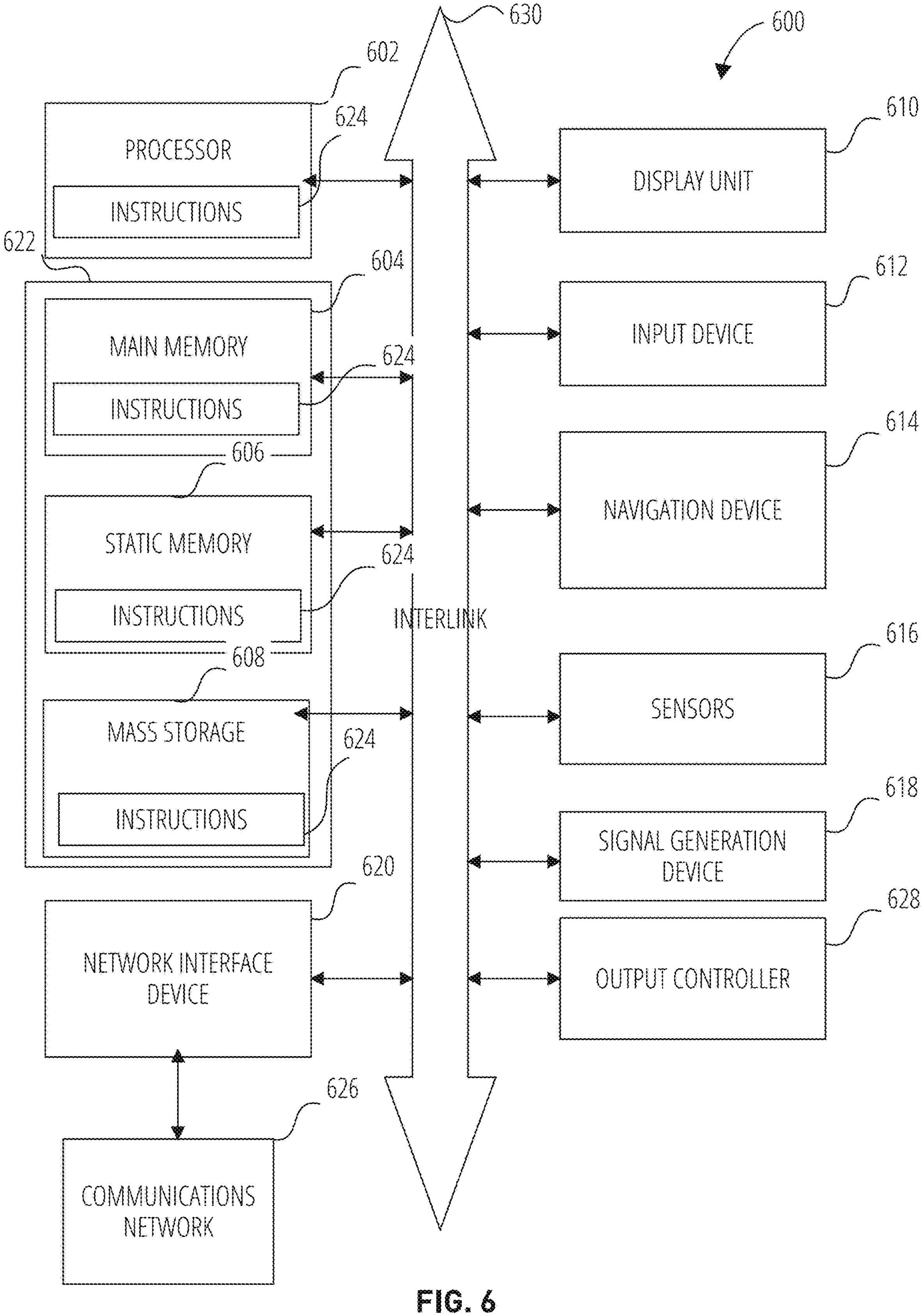
FIG. 6 is a block diagram of an example of portions of a machine upon which one or more portions of the present disclosure may be implemented.

FIG. 6 illustrates a block diagram of an example machine 600 upon which any one or more of the techniques (e.g., methodologies) discussed herein may be implemented. Examples, as described herein, may include, or may operate by, logic or a number of components, or mechanisms in the machine 600. Circuitry (e.g., processing circuitry) is a collection of circuits implemented in tangible entities of the machine 600 that include hardware circuitry (e.g., simple circuits, gates, logic, etc.). Circuitry membership may be flexible over time. Circuitries include members that may, alone or in combination, perform specified operations when operating. In an example, hardware circuitry of the circuitry may be immutably designed to carry out a specific operation (e.g., hardwired). In an example, the hardware circuitry of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware circuitry constituent are changed, for example, from an insulator to a conductor or vice versa. The instructions enable embedded hardware circuitry (e.g., the execution units or a loading mechanism) to create members of the circuitry in hardware circuitry via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 600 follow.

In alternative examples, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 600 may include a hardware circuitry processor 602 (e.g., a central processing unit (CPU), a graphics processing unit (GPU), a hardware circuitry processor core, or any combination thereof), a main memory 604, a static memory (e.g., memory or storage for firmware, microcode, a basic-input-output (BIOS), and mass storage 608 (e.g., hard drives, tape drives, flash storage, or other block devices) some or all of which may communicate with each other via an interlink 630 (e.g., bus). The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a signal generation device 618 (e.g., a speaker), a network interface device 620, and one or more sensors 616, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 602, the main memory 604, the static memory 606, or the mass storage 608 may be, or include, a machine readable medium 622 on which is stored one or more sets of data structures or instructions 624 (e.g., software) embodying or utilized by any one or more of the techniques or functions described herein. The instructions 624 may also reside, completely or at least partially, within any of registers of the processor 602, the main memory 604, the static memory 606, or the mass storage 608 during execution thereof by the machine 600. In an example, one or any combination of the hardware circuitry processor 602, the main memory 604, the static memory 606, or the mass storage 608 may constitute the machine readable media 622. While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 622 may be representative of the instructions 624, such as instructions 624 themselves or a format from which the instructions 624 may be derived. This format from which the instructions 624 may be derived may include source code, encoded instructions (e.g., in compressed or encrypted form), packaged instructions (e.g., split into multiple packages), or the like. The information representative of the instructions 624 in the machine readable medium 622 may be processed by processing circuitry into the instructions to implement any of the operations discussed herein. For example, deriving the instructions 624 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 624.

In an example, the derivation of the instructions 624 may include assembly, compilation, or interpretation of the information (e.g., by the processing circuitry) to create the instructions 624 from some intermediate or preprocessed format provided by the machine readable medium 622. The information, when provided in multiple parts, may be combined, unpacked, and modified to create the instructions 624. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 624 may be further transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. A transmission medium is a machine-readable medium.

The following, non-limiting examples, detail certain aspects of the present subject matter to solve the challenges and provide the benefits discussed herein, among others.

EXAMPLES

Example 1 is an analog-to-digital converter (ADC) system for switching between a first operating mode and a second operating mode, wherein both the first operating mode and the second operating mode include post-calibration analog-to-digital conversions, wherein a hardware circuitry configuration of the second operating mode differs from a hardware circuitry configuration of the first operating mode, the ADC system comprising: hardware circuitry; and a controller, configured to control the hardware circuitry to control switching between the first operating mode and the second operating mode in response to a command to switch from the first operating mode to the second operating mode, including to: transmit second mode configuration information and second mode calibration information to the hardware circuitry, wherein the second mode configuration information includes values to configure the hardware circuitry to operate in the second operating mode and the second mode calibration information includes values to calibrate the ADC system while operating in the second operating mode.

In Example 2, the subject matter of Example 1 optionally includes wherein, following transmitting the second mode calibration information, the controller is configured to: trigger the hardware circuitry to begin operating in the second operating mode.

In Example 3, the subject matter of Example 2 optionally includes wherein, before triggering the hardware circuitry to begin operating in the second mode, the controller is configured to: pause calibration of the first operating mode; and record first mode calibration information, including values to calibrate the ADC system while operating in the first operating mode.

In Example 4, the subject matter of Example 3 optionally includes wherein the hardware circuitry includes: calibration storage registers, configured to receive the second mode calibration information; calibration operation registers, configured to hold the calibration information for an operating mode; and a latch circuit, configured to write the values from the calibration storage registers to the calibration operation registers when the controller triggers the hardware circuitry to begin operating in the second operating mode.

In Example 5, the subject matter of any one or more of Examples 2-4 optionally include wherein the second operating mode begins operating without requiring the ADC system to power cycle or reboot.

In Example 6, the subject matter of any one or more of Examples 1-5 optionally include wherein: the ADC system includes an interleaving ADC; the first operating mode includes a sequential operating mode; and the second operating mode includes a random or pseudo-random operating mode.

In Example 7, the subject matter of Example 6 optionally includes wherein, in use: the first operating mode has a higher signal-to-noise ratio than the second operating mode; and the second operating mode has smaller spurs in an operating spectrum than the first operating mode.

In Example 8, the subject matter of any one or more of Examples 1-7 optionally include wherein: the ADC system includes an interleaving ADC; the first operating mode includes a sequential operating mode; and the second operating mode includes a sequential operating mode with a different number of interleaving slices than the first operating mode.

In Example 9, the subject matter of Example 8 optionally includes wherein: the first operating mode includes more interleaving slices than the second operating mode; and the first operating mode has a higher sampling rate than the second operating mode.

In Example 10, the subject matter of Example 9 optionally includes wherein: the second operating mode has a higher signal-to-noise ratio than the first operating mode.

In Example 11, the subject matter of any one or more of Examples 1-10 optionally include wherein the controller is configured to: transmit state information to the hardware circuitry, wherein the state information includes values to program a state of a hardware circuitry state machine.

In Example 12, the subject matter of any one or more of Examples 1-11 optionally include wherein at startup, the controller is configured to: configure the hardware circuitry to operate in the second operating mode and record the second mode calibration information; and configure the hardware circuitry to operate in the first operating mode and record first mode calibration information.

Example 13 is a method for switching between a first operating mode and a second operating mode of an analog-to-digital converter (ADC), wherein both the first operating mode and the second operating mode include post-calibration analog-to-digital conversions, wherein a hardware circuitry configuration of the second operating mode differs from a hardware circuitry configuration of the first operating mode, the method comprising: transmitting second mode configuration information and second mode calibration information to hardware circuitry of the ADC, wherein the second mode configuration information includes values to configure the hardware circuitry to operate in the second operating mode and the second mode calibration information includes values to calibrate the ADC while operating in the second operating mode; and triggering the hardware circuitry to begin operating in the second operating mode.

In Example 14, the subject matter of Example 13 optionally includes following transmitting the second mode configuration information and the second mode calibration information, waiting until a "switch" signal is received before triggering the hardware circuitry to begin operating in the second operating mode.

In Example 15, the subject matter of any one or more of Examples 13-14 optionally include pausing calibration of the first operating mode; and recording first mode calibration information, including values to calibrate the ADC while operating in the first operating mode.

In Example 16, the subject matter of Example 15 optionally includes discarding data generated by the ADC while operating in the second operating mode; pausing calibration of the second operating mode; transmitting first mode configuration information and the first mode calibration information to the hardware circuitry; and triggering the hardware circuitry to begin operating in the first operating mode.

In Example 17, the subject matter of any one or more of Examples 13-16 optionally include wherein: the ADC includes an interleaving ADC; the first operating mode includes a sequential operating mode; and the second operating mode includes a random or pseudo-random operating mode.

In Example 18, the subject matter of Example 17 optionally includes switching to the second operating mode when an operating spectrum with smaller spurs is specified; and switching to the first operating mode when a higher signal-to-noise ratio is specified.

Example 19 is an analog-to-digital converter (ADC) system for switching between a first operating mode and a second operating mode, wherein both the first operating mode and the second operating mode include post-calibration analog-to-digital conversions, wherein a hardware circuitry configuration of the second operating mode differs from a hardware circuitry configuration of the first operating mode, the ADC system comprising: hardware circuitry; and a controller, configured to control the hardware circuitry to control switching between the first operating mode and the second operating mode in response to a command to switch from the first operating mode to the second operating mode, including to: transmit second mode configuration information and second mode calibration information to the hardware circuitry, wherein the second mode configuration information includes values to configure the hardware circuitry to operate in the second operating mode and the second mode calibration information includes values to calibrate the ADC system while operating in the second operating mode; wherein the hardware circuitry includes: calibration storage registers, configured to receive the second mode calibration information; and calibration operation registers, configured to hold the calibration information for an operating mode.

In Example 20, the subject matter of Example 19 optionally includes wherein the controller is configured to: transmit state information to the hardware circuitry, wherein the state information includes values to program a state of a hardware circuitry state machine.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

What is claimed is:

1. An analog-to-digital converter (ADC) system for switching between a first operating mode and a second operating mode, wherein both the first operating mode and the second operating mode include post-calibration analog-to-digital conversions, wherein a hardware circuitry configuration of the second operating mode differs from a hardware circuitry configuration of the first operating mode, the ADC system comprising:

hardware circuitry; and a controller, configured to control the hardware circuitry to control switching between the first operating mode and the second operating mode in response to a command to switch from the first operating mode to the second operating mode, including to:

transmit second mode configuration information and second mode calibration information to the hardware circuitry, wherein the second mode configuration information includes values to configure the hardware circuitry to operate in the second operating mode and the second mode calibration information includes values to calibrate the ADC system while operating in the second operating mode.

2. The ADC system of claim 1, wherein, following transmitting the second mode calibration information, the controller is configured to:

trigger the hardware circuitry to begin operating in the second operating mode.

3. The ADC system of claim 2, wherein, before triggering the hardware circuitry to begin operating in the second mode, the controller is configured to:

pause calibration of the first operating mode; and record first mode calibration information, including values to calibrate the ADC system while operating in the first operating mode.

4. The ADC system of claim 3, wherein the hardware circuitry includes:

calibration storage registers, configured to receive the second mode calibration information;

calibration operation registers, configured to hold the calibration information for an operating mode; and a latch circuit, configured to write the values from the calibration storage registers to the calibration operation registers when the controller triggers the hardware circuitry to begin operating in the second operating mode.

5. The ADC system of claim 2, wherein the second operating mode begins operating without requiring the ADC system to power cycle or reboot.

6. The ADC system of claim 1, wherein:
the ADC system includes an interleaving ADC;
the first operating mode includes a sequential operating mode; and
the second operating mode includes a random or pseudo-random operating mode.

7. The ADC system of claim 6, wherein, in use:
the first operating mode has a higher signal-to-noise ratio than the second operating mode; and
the second operating mode has smaller spurs in an operating spectrum than the first operating mode.

8. The ADC system of claim 1, wherein:
the ADC system includes an interleaving ADC;
the first operating mode includes a sequential operating mode; and
the second operating mode includes a sequential operating mode with a different number of interleaving slices than the first operating mode.

9. The ADC system of claim 8, wherein:
the first operating mode includes more interleaving slices than the second operating mode; and
the first operating mode has a higher sampling rate than the second operating mode.

10. The ADC system of claim 9, wherein:
the second operating mode has a higher signal-to-noise ratio than the first operating mode.

11. The ADC system of claim 1, wherein the controller is configured to:
transmit state information to the hardware circuitry, wherein the state information includes values to program a state of a hardware circuitry state machine.

12. The ADC system of claim 1, wherein at startup, the controller is configured to:
configure the hardware circuitry to operate in the second operating mode and record the second mode calibration information; and
configure the hardware circuitry to operate in the first operating mode and record first mode calibration information.

13. A method for switching between a first operating mode and a second operating mode of an analog-to-digital converter (ADC), wherein both the first operating mode and the second operating mode include post-calibration analog-to-digital conversions, wherein a hardware circuitry configuration of the second operating mode differs from a hardware circuitry configuration of the first operating mode, the method comprising:
transmitting second mode configuration information and second mode calibration information to hardware circuitry of the ADC, wherein the second mode configuration information includes values to configure the hardware circuitry to operate in the second operating mode and the second mode calibration information includes values to calibrate the ADC while operating in the second operating mode; and
triggering the hardware circuitry to begin operating in the second operating mode.

14. The method of claim 13, comprising:
following transmitting the second mode configuration information and the second mode calibration information, waiting until a "switch" signal is received before triggering the hardware circuitry to begin operating in the second operating mode.

15. The method of claim 13, comprising:
pausing calibration of the first operating mode; and
recording first mode calibration information, including values to calibrate the ADC while operating in the first operating mode.

16. The method of claim 15, comprising:
discarding data generated by the ADC while operating in the second operating mode;
pausing calibration of the second operating mode;
transmitting first mode configuration information and the first mode calibration information to the hardware circuitry; and
triggering the hardware circuitry to begin operating in the first operating mode.

17. The method of claim 13, wherein:
the ADC includes an interleaving ADC;
the first operating mode includes a sequential operating mode; and
the second operating mode includes a random or pseudo-random operating mode.

18. The method of claim 17, comprising:
switching to the second operating mode when an operating spectrum with smaller spurs is specified; and
switching to the first operating mode when a higher signal-to-noise ratio is specified.

19. An analog-to-digital converter (ADC) system for switching between a first operating mode and a second operating mode, wherein both the first operating mode and the second operating mode include post-calibration analog-to-digital conversions, wherein a hardware circuitry configuration of the second operating mode differs from a hardware circuitry configuration of the first operating mode, the ADC system comprising:
hardware circuitry; and
a controller, configured to control the hardware circuitry to control switching between the first operating mode and the second operating mode in response to a command to switch from the first operating mode to the second operating mode, including to:
transmit second mode configuration information and second mode calibration information to the hardware circuitry, wherein the second mode configuration information includes values to configure the hardware circuitry to operate in the second operating mode and the second mode calibration information includes values to calibrate the ADC system while operating in the second operating mode;
wherein the hardware circuitry includes:
calibration storage registers, configured to receive the second mode calibration information; and
calibration operation registers, configured to hold the calibration information for an operating mode.

20. The ADC system of claim 19, wherein the controller is configured to:
transmit state information to the hardware circuitry, wherein the state information includes values to program a state of a hardware circuitry state machine.

* * * * *